United States Patent
Yoon

(10) Patent No.: US 8,369,137 B2
(45) Date of Patent: Feb. 5, 2013

(54) SEMICONDUCTOR MEMORY DEVICE INCLUDING A WRITE DRIVER TO OUTPUT A PROGRAM SIGNAL

(75) Inventor: Hyuck Soo Yoon, Cheongju (KR)

(73) Assignee: Hynix Semiconductor Inc., Icheon (KR)

( * ) Notice: Subject to any disclaimer, the term of this patent is extended or adjusted under 35 U.S.C. 154(b) by 200 days.

(21) Appl. No.: 12/827,830

(22) Filed: Jun. 30, 2010

(65) Prior Publication Data

US 2011/0182113 A1    Jul. 28, 2011

(30) Foreign Application Priority Data

Jan. 28, 2010 (KR) .................. 10-2010-0007862

(51) Int. Cl.
*G11C 11/00* (2006.01)
*G11C 29/00* (2006.01)
(52) U.S. Cl. .................. 365/163; 365/201; 365/148
(58) Field of Classification Search .................. 365/163, 365/201, 148
See application file for complete search history.

(56) References Cited

U.S. PATENT DOCUMENTS

| 6,654,290 | B2 * | 11/2003 | Lee et al. ................. 365/185.23 |
| 7,379,339 | B2 * | 5/2008 | Paparisto et al. ........ 365/185.21 |
| 2009/0185436 | A1 * | 7/2009 | Kim ......................... 365/189.16 |
| 2009/0296459 | A1 * | 12/2009 | Kim et al. .................... 365/163 |

FOREIGN PATENT DOCUMENTS

| KR | 1020020057687 A | 7/2002 |
| KR | 1020050118332 A | 12/2005 |
| KR | 1020080021395 A | 3/2008 |
| KR | 1020080023582 A | 3/2008 |

* cited by examiner

*Primary Examiner* — Hoai V Ho
*Assistant Examiner* — Tri Hoang

(57) ABSTRACT

A semiconductor memory device prevents a faulty operation of a program operation, and increases the reliability of operation. The semiconductor memory device includes a unit cell including a memory element configured to have a different resistance value in response to data, and a write driver configured to output a program current and voltage for programming the unit cell in response to a test signal.

15 Claims, 4 Drawing Sheets

SEMICONDUCTOR MEMORY DEVICE INCLUDING A WRITE DRIVER TO OUTPUT A PROGRAM SIGNAL

CROSS-REFERENCE TO RELATED APPLICATION

The priority of Korean patent application No. 10-2010-0007862 filed on Jan. 28, 2010, the disclosure of which is hereby incorporated in its entirety by reference, is claimed.

BACKGROUND OF THE INVENTION

Embodiments of the present invention relate to a semiconductor memory device.

Semiconductor memory devices have been rapidly developed to temporarily or permanently store data therein. The semiconductor memory devices have been widely used in a variety of electronic appliances, electronic devices, and personal portable devices. General semiconductor memory devices can freely read and/or write data, and can also easily update old data to new data.

The semiconductor memory device has been developed such that it can store an increasing amount of data therein, operate with a small amount of power, and increase or expedite an operating speed. Although a NOR flash memory device or a NAND flash memory device has been widely used as a non-volatile memory, a conventional flash memory device has a disadvantage in that it has a slow operating speed.

In order to overcome the above-mentioned disadvantage, a phase change random access memory (PCRAM) has been developed. The PCRAM changes a resistance value of a material contained in a unit cell to another resistance value using a current signal, stores data corresponding to the changed resistance value, and reads a difference in current between two resistance values. The PCRAM includes a material causing a temperature-based phase change in a unit cell, and a crystal structure of the material changes to a crystalline state or an amorphous state according to a temperature generated by a current flowing through the material. For example, the material may use germanium antimony tellurium (Ge2Sb2Te5, GST) whose resistance value is changed according to a crystalline or amorphous state.

BRIEF SUMMARY OF THE INVENTION

Embodiments of the present invention are directed to providing a semiconductor memory device that substantially obviates one or more problems due to limitations and disadvantages of the related art.

An embodiment of the present invention relates to a semiconductor memory device for programming data in response to an amount of a current flowing in a unit cell. The semiconductor memory device detects a voltage and an amount of a current flowing in a unit cell during a program operation in a test mode, verifies the presence or absence of a faulty operation by referring to the detected current and voltage, and, if the presence of the faulty operation is verified, checks a cause of the faulty operation, thereby improving the reliability.

In accordance with one aspect of the present invention, there is provided a semiconductor memory device including a unit cell including a memory element configured to have a different resistance value in response to data, and a write driver configured to output a program current and voltage for programming the unit cell in response to a test signal.

In accordance with another aspect of the present invention, there is provided a semiconductor memory device for monitoring a program current and voltage output from a write driver in response to a program command during a test operation, or measuring a resistance value of a program path inside a cell array including a unit cell.

In accordance with another aspect of the present invention, there is provided a semiconductor memory device including a cell array configured to include a plurality of unit cells, a write driver configured to output a program current for carrying out a write operation, and a pad configured to measure the program current, wherein the write driver configured to monitor the program current and voltage in response to a program command during a test operation, or measure a resistance value of a program path contained in the cell array.

In accordance with another aspect of the present invention, there is provided a phase-change memory device including a unit cell configured to include a phase-change resistance memory element, a write driver configured to generate a program current for programming the phase-change resistance memory element; and a test pad configured to output the program current in response to a test signal.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

Embodiments of the present invention provide a technology of coupling a test circuit, which can detect a current flowing in a unit cell and to a write driver to analyze a cause of a faulty operation of a semiconductor memory device when an abnormal current flows in the unit cell.

In particular, the semiconductor memory device according to embodiments of the present invention includes a pad capable of detecting a current and a voltage, such that it is possible to recognize whether a low level of a program current controlled with an analog level in a write driver or a resistance value of a program path including the unit cell causes an unexpected problem. If the program current is detected by the pad, it is possible to directly test the write driver. In addition, if the pad detects the program current and voltage, it is possible to measure an actual resistance value of the program path, and to compare the actual resistance value with a resistance value which is expected when designing the semiconductor memory device to thereby recognize what the problem is.

Figure 1:
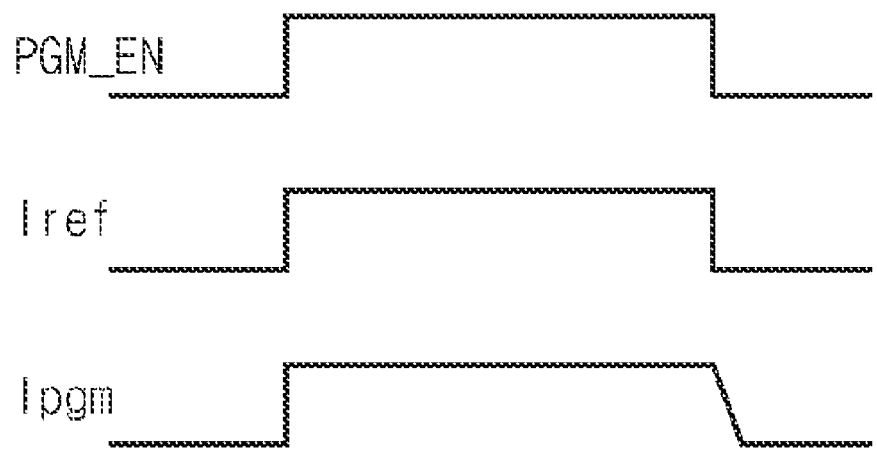
FIG. 1 is a waveform diagram illustrating a program operation of a semiconductor memory device according to an embodiment of the present invention.

FIG. 1 is a waveform diagram illustrating a program operation of a semiconductor memory device according to an embodiment of the present invention.

Referring to FIG. 1, if a program enable signal PGM_EN is activated to a logic high level, a reference current Iref flows between a high voltage (VPP) input terminal and a ground voltage (VSS) input terminal of a write driver, and a mirroring program current Ipgm of the reference current Iref also flows. A process for generating a program current and a process for measuring the program current in a test operation will hereinafter be described with reference to the following detailed circuit diagrams.

Figure 2:
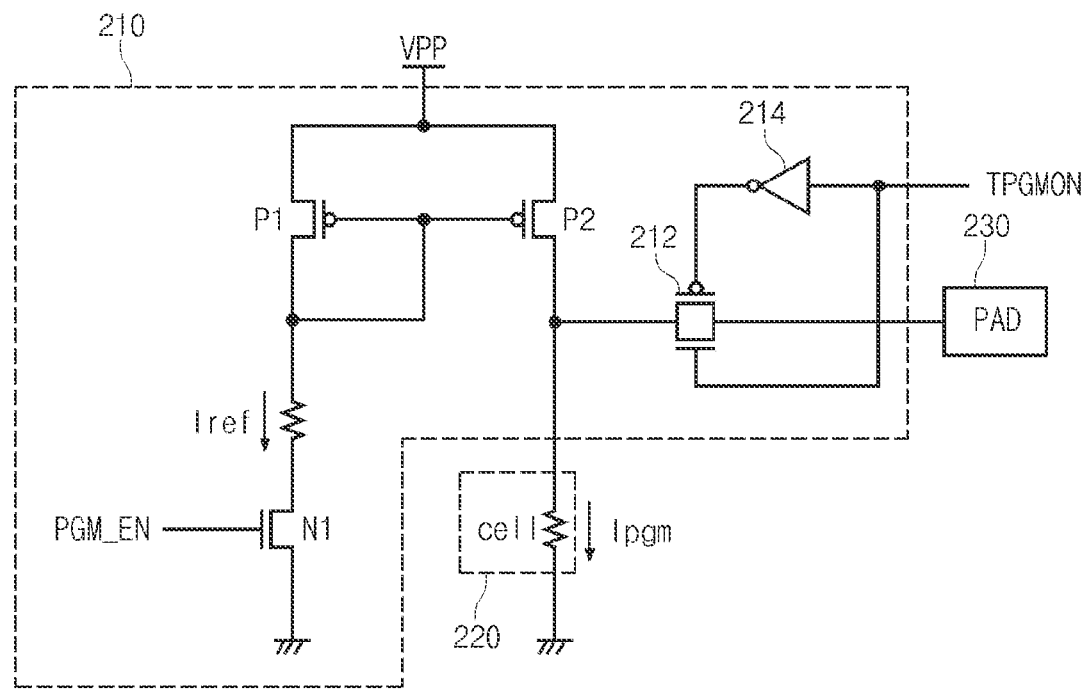
FIG. 2 is a circuit diagram illustrating a program operation of a semiconductor memory device according to a first embodiment of the present invention.

FIG. 2 is a circuit diagram illustrating a program operation of a semiconductor memory device according to a first embodiment of the present invention.

Referring to FIG. 2, a unit cell contained in the semiconductor memory device according to the first embodiment of the present invention may include a phase-change memory element.

The semiconductor memory device according to the first embodiment of the present invention includes a write driver 210 and a unit cell 220.

Although a program path including a bit line and a variety of switching circuits is formed between the write driver 210 and the unit cell 220, the program path is regarded as a wire having a low resistance value herein, and detailed description thereof will be omitted for the convenience of description.

Likewise, although the unit cell 220 includes a phase-change memory element for storing data, a word line, and a transistor or a diode, only a resistance value of the program path through which a current flows has the meaning in the program operation. Therefore, detailed description for the other things will be omitted herein for the convenience of description.

The write driver 210 includes a first NMOS transistor N1 and a current mirror including a first PMOS transistor P1 and a second PMOS transistor P2. The first NMOS transistor N1 is turned on by a program enable signal PGM_EN activated by a program command. The first PMOS transistor P1 is coupled to a high voltage (VPP) input terminal, such that a reference voltage Iref flows through the first NMOS transistor N1. The second PMOS transistor P2 outputs a program current Ipgm by mirroring the reference current Iref.

The write driver 210 further includes a test circuit for measuring the program current Ipgm flowing between the second PMOS transistor P2 and the unit cell 220. The test circuit includes a transfer gate 212 and an inverter 214. The transfer gate 212 outputs the program current Ipgm to a test pad 230 in response to a test signal TPGMON and an inverted test signal activated during a test operation, and the inverter 214 generates the inverted test signal by inverting the test signal TPGMON.

The semiconductor memory device according to the first embodiment of the present invention activates the transfer gate 212 coupled to the test pad 230 when the test signal TPGMON is enabled during the program operation in a test mode, thereby recognizing a voltage between the write driver 210 and the unit cell 220. If the voltage is measured through the test pad 230, it is also possible to measure the resistance value of the program path.

In this embodiment, the test pad 230 may be separately formed to measure the voltage in the semiconductor memory device.

In accordance with another embodiment, since a plurality of pads for inputting/outputting data, a control signal, an address, etc. between the semiconductor memory device and an external device is not used during the test mode, one of the pads may be used as the test pad 230. In this embodiment, it is not necessary to manufacture an additional pad, and thus the layout of the semiconductor memory device can be effectively utilized.

Since the test circuit comprised of the transfer gate 212 and the inverter 214 can be easily applied to not only the write driver 210 but also other components (e.g., a global bit line, a bit line, a sense-amplifier, etc.) of the semiconductor memory device, it is possible to perform a detailed test operation on components of the semiconductor memory device.

In this case, since no current flows through the test pad 230 to detect the voltage, an operation of the semiconductor memory device is not obstructed or distorted by increased resistance.

Figure 3:
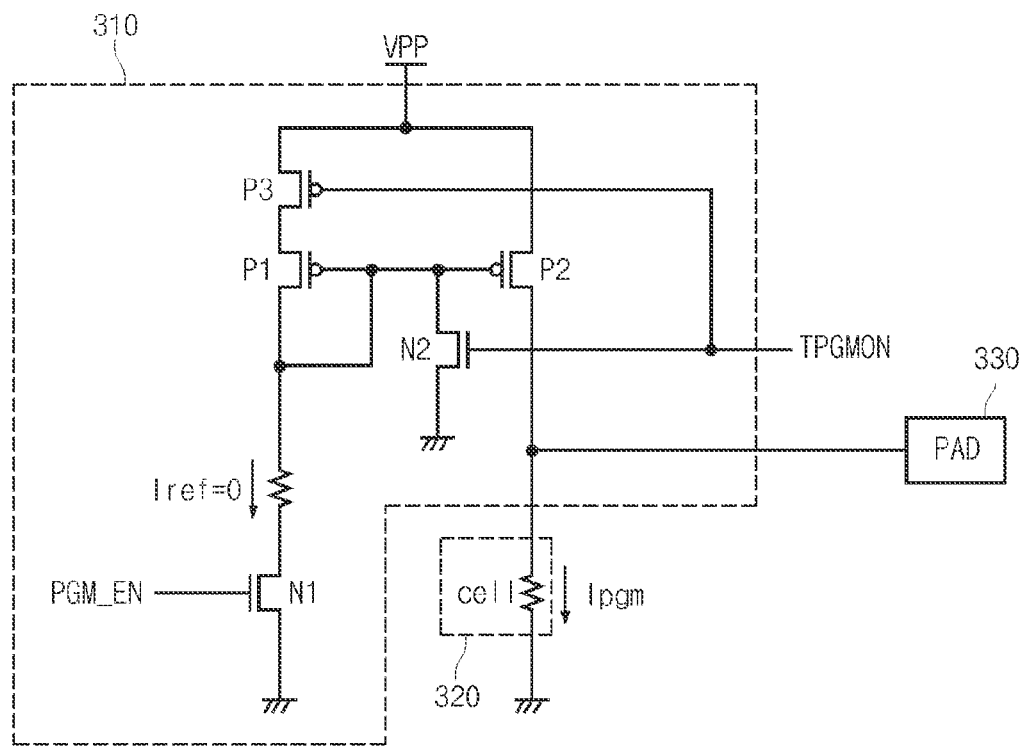
FIG. 3 is a circuit diagram illustrating a program operation of a semiconductor memory device according to a second embodiment of the present invention.

FIG. 3 is a circuit diagram illustrating a program operation of a semiconductor memory device according to a second embodiment of the present invention.

Referring to FIG. 3, a unit cell contained in the semiconductor memory device according to the second embodiment of the present invention may include a phase-change memory device.

As can be seen from FIG. 3, the semiconductor memory device according to the second embodiment of the present invention includes a write driver 310 and a unit cell 320.

In particular, the write driver 310 includes a first NMOS transistor N1, a current mirror circuit composed of a first PMOS transistor P1 and a second PMOS transistor P2, and a test circuit composed of a third PMOS transistor P3 and a second NMOS transistor N2. In this case, the third PMOS transistor P3 and the second NMOS transistor N2 contained in the test circuit are activated in response to a test signal TPGMON, such that a test pad 330 may output a program current Ipgm although the current mirror circuit is not activated.

In accordance with the second embodiment of the present invention, although the reference current Iref is fixed at '0' because the program enable signal PGM_EN is not activated, the program current Ipgm can be output according to the test signal TPGMON. Therefore, the semiconductor memory device disclosed in the second embodiment is advantageous in that it can measure only the program current Ipgm flowing in the unit cell 320 during a test operation.

In other words, since the measured program current Ipgm is not a program current obtained from the operation of the write driver 310, a resistance value of the write driver 310 (i.e., a resistance value of the second PMOS transistor P2) is insignificant and can be easily predicted, so that a resistance value of a program path including the unit cell 320 can be more accurately measured.

In addition, the semiconductor memory device according to the second embodiment of the present invention prevents unnecessary operations of the write driver 320 during the test operation, and thus prevents unnecessary power consumption.

Figure 4:
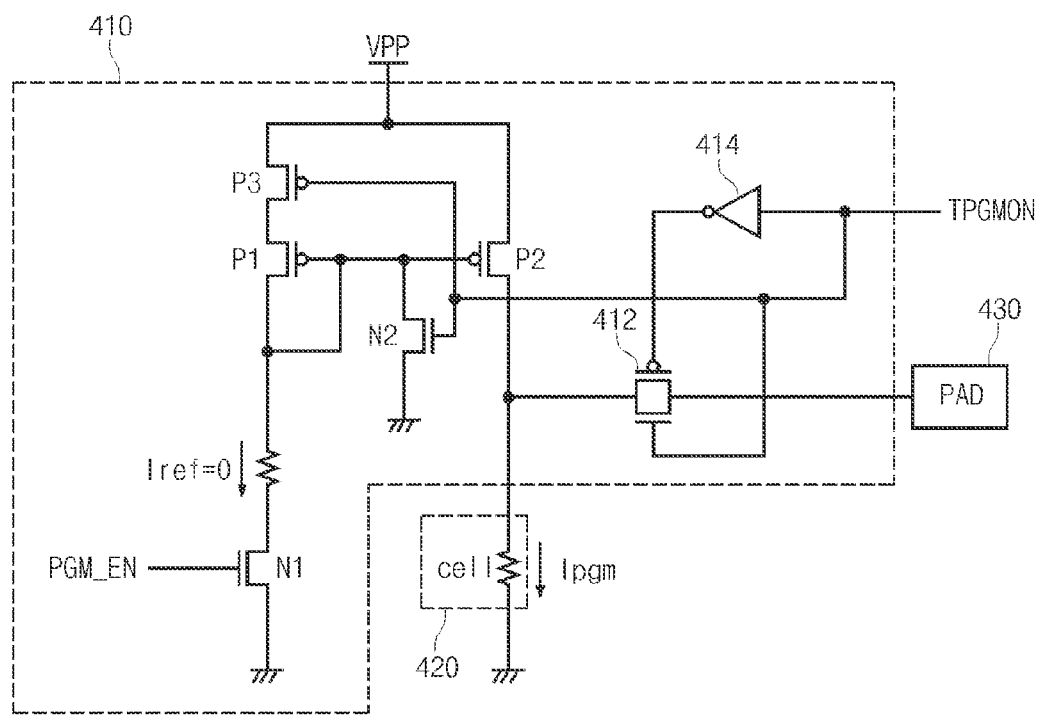
FIG. 4 is a circuit diagram illustrating a program operation of a semiconductor memory device according to a third embodiment of the present invention.

FIG. 4 is a circuit diagram illustrating a program operation of a semiconductor memory device according to a third embodiment of the present invention.

Referring to FIG. 4, a unit cell contained in the semiconductor memory device according to the third embodiment of the present invention may include a phase-change memory device.

As can be seen from FIG. 4, the semiconductor memory device according to the third embodiment of the present invention includes a write driver 410 and a unit cell 420.

In particular, the write driver 410 includes a first NMOS transistor N1, a current mirror circuit composed of a first PMOS transistor P1 and a second PMOS transistor P2, and a test circuit composed of a third PMOS transistor P3, a second NMOS transistor N2, a transfer gate 412 and an inverter 414.

The test circuit outputs a program current Ipgm to a test pad 430 in response to a test signal TPGMON activated in a test operation.

In this case, as shown in FIG. 4, the semiconductor memory device according to the third embodiment of the present invention may include all characteristics of the semiconductor memory devices according to the first and second embodiments of the present invention.

The semiconductor memory device according to the third embodiment of the present invention outputs the program current Ipgm or a voltage in response to the test signal TPGMON under the condition that no reference current Iref flows (i.e., the write driver 410 does not operate), such that a resistance value of a program path including the unit cell 420 can be measured.

In addition, the semiconductor memory device may check an operation of the write driver 410 by outputting the program current Ipgm in response to a program enable signal PGM_EN activated by a program command and the test signal TPGMON.

In accordance with another embodiment of the present invention, although it is not shown, the write driver further includes an amplification circuit to generate the program current. The amplification operation of the amplification circuit is controlled by the program enable signal. The amplification circuit may generate the program current in response to the test signal. In this case, the test circuit may selectively connect the amplification circuit to the test pad. Some parts of the above-described circuits in the write driver may act as the amplification circuit.

In the semiconductor memory device for programming data according to an amount of a current flowing in a unit cell, the program current has analog characteristics differently from digital data, such that it is difficult to control the program current, and thus a faulty operation or malfunction may be easily caused.

However, in accordance with the embodiments of the present invention, since the test circuit is added to the write driver, and although unexpected errors are encountered in the program operation of the semiconductor memory device, it is possible to correctly analyze the cause of such errors.

In particular, if an unexpected problem occurs in the program operation, it is possible to correctly determine whether the problem is caused either in the program path including the unit cell or in the write driver. In addition, the stability of processes for designing and manufacturing the semiconductor memory device is increased by using the program current or voltage obtained through the test circuit, which results in increased productivity. In the case of using the above-mentioned semiconductor memory device, it is possible to recognize a minimum voltage needed for a normal program operation, such that an optimized low-power semiconductor memory device can be designed.

As apparent from the above description, the above-mentioned embodiments of the present invention have the following characteristics.

First, since a semiconductor memory device for programming data in response to an amount of a current flowing in a unit cell according to one aspect of the present invention provides a method for checking a resistance value of a write path including a write driver and the unit cell during a programming mode of the semiconductor memory device, if a faulty operation is generated during a program operation, it is possible to test which areas belonging to the write path relates to the faulty operation.

In addition, the semiconductor memory device can recognize a minimum voltage needed for normally carrying out a program operation of the semiconductor memory device through a test operation. Therefore, a circuit design corresponding to the minimum voltage can be implemented, and a semiconductor memory device appropriate for low-power environment can be developed.

Those skilled in the art will appreciate that the present invention may be carried out in other specific ways than those set forth herein without departing from the spirit and essential characteristics of the present invention. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor memory device comprising:
   a unit cell including a memory element configured to have a different resistance value in response to data; and
   a write driver configured to output a program signal to program the unit cell in response to a test signal,
   wherein the write driver includes:
      a current mirror circuit configured to mirror a reference current in response to a program command, and provide the program signal to the unit cell; and
      a test circuit electrically coupled to an output terminal of the current mirror circuit and configured to transmit the program signal to a test pad in response to the test signal.

2. The semiconductor memory device according to claim 1, wherein the test circuit includes:
   a transfer gate coupled between the current mirror circuit and the unit cell, and configured to transmit the program signal to the test pad in response to the test signal.

3. The semiconductor memory device according to claim 1, wherein the test circuit is configured to output the program signal even when the reference current does not flow, and the program signal is an electrical signal including a current.

4. The semiconductor memory device according to claim 3, wherein the test circuit includes:
   a first MOS transistor coupled between the current mirror circuit and a high voltage input terminal, and configured to operate in response to the test signal; and
   a second MOS transistor configured to activate the current mirror circuit in response to the test signal, and output the program signal,
   wherein the test pad is coupled to the output terminal of the current mirror circuit.

5. The semiconductor memory device according to claim 3, wherein the test circuit includes:
- a first MOS transistor coupled between the current mirror circuit and a high voltage input terminal, and configured to operate in response to the test signal;
- a second MOS transistor configured to activate the current mirror circuit in response to the test signal; and
- a transfer gate coupled between the current mirror circuit and the unit cell, and configured to transmit the program signal to the test pad in response to the test signal.

6. The semiconductor memory device according to claim 1, wherein the write driver outputs the program signal when the test signal is activated, thereby measuring a resistance value of the unit cell, and the program signal is a voltage signal.

7. The semiconductor memory device according to claim 1, wherein the write driver outputs the program signal when the program command and the test signal are activated, thereby testing an operation of the write driver.

8. A semiconductor memory device comprising:
- a cell array including a plurality of unit cells, each unit cell including a memory element configured to have a different resistance value in response to data;
- a write driver configured to output a program signal to perform a write operation on the cell array; and
- a pad coupled to the write driver and configured to receive the program signal and transmit the program signal to an external measuring device,
- wherein the program signal is monitored or a resistance value of a program path included in the cell array is measured by the external measuring device in response to a program command during a test operation.

9. The semiconductor memory device according to claim 8, wherein the write driver includes:
- a current mirror circuit configured to mirror a reference current in response to the program command, and provide the program signal to each of the unit cells; and
- a test circuit electrically coupled to the current mirror circuit and configured to output the program signal to the pad during the test operation.

10. The semiconductor memory device according to claim 9, wherein the test circuit includes:
- a first MOS transistor coupled between the current mirror circuit and a high voltage input terminal, and configured to operate in response to a test signal;
- a second MOS transistor configured to activate the current mirror circuit in response to the test signal, and output the program signal; and
- a transfer gate coupled between the current mirror circuit and the unit cell, and configured to transmit the program signal to the pad in response to the test signal.

11. The semiconductor memory device according to claim 8, wherein the program path includes a global bit line, a bit line switch, a bit line and a unit cell.

12. A phase-change memory device comprising:
- a unit cell configured to include a phase-change resistance memory element;
- a write driver configured to generate a program current for programming the phase-change resistance memory element; and
- a test pad coupled to the write driver and configured to output the program current to an external measuring device,
- wherein the write driver includes:
    - a current mirror circuit configured to mirror a reference current in response to a program command, and provide the program current to the unit cell; and
    - a test circuit electrically coupled to an output terminal of the current mirror circuit and configured to transmit the program current to the test pad in response to a test signal.

13. The phase-change memory device according to claim 12, wherein the write driver further includes:
- an amplification circuit configured to generate the program current.

14. The phase-change memory device according to claim 13, wherein the test circuit selectively couples the amplification circuit to the test pad in response to the test signal.

15. The phase-change memory device according to claim 13, wherein the amplification circuit controls its own amplification operation in response to a program enable signal.

* * * * *